United States Patent
Yoshihara et al.

(10) Patent No.: US 7,599,641 B2
(45) Date of Patent: Oct. 6, 2009

(54) EXHAUST SYSTEM OF IMAGE FORMING DEVICE

(75) Inventors: Hideo Yoshihara, Dongguan (CN); Masamitsu Ukai, Nagoya (JP); Yoshiteru Hattori, Bisai (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 12/078,279

(22) Filed: Mar. 28, 2008

(65) Prior Publication Data
US 2008/0187349 A1 Aug. 7, 2008

Related U.S. Application Data

(62) Division of application No. 10/643,216, filed on Aug. 19, 2003, now Pat. No. 7,403,741.

(30) Foreign Application Priority Data
Aug. 30, 2002 (JP) ............... 2002-252233

(51) Int. Cl.
*G03G 21/20* (2006.01)
(52) U.S. Cl. .......................... 399/94; 399/92
(58) Field of Classification Search .................. 399/33, 399/44, 69, 88, 89, 92–94, 411; 355/30
See application file for complete search history.

(56) References Cited

U.S. PATENT DOCUMENTS

| | | | |
|---|---|---|---|
| 5,073,796 A | 12/1991 | Suzuki et al. | |
| 5,452,072 A | 9/1995 | Ichinokawa et al. | |
| 5,887,226 A | 3/1999 | Taki | |
| 6,173,132 B1 | 1/2001 | Kida et al. | |
| 6,219,504 B1 | 4/2001 | Matsuzaki et al. | |
| 6,266,498 B1 * | 7/2001 | Oda et al. | 399/92 |
| 6,415,118 B1 | 7/2002 | Setoriyama et al. | |
| 6,522,847 B2 | 2/2003 | Nanjo | |
| 6,594,456 B2 * | 7/2003 | Kimizuka et al. | 399/92 |
| 6,603,938 B2 * | 8/2003 | Tsubakimoto | 399/92 |
| 6,892,040 B2 | 5/2005 | Ahn et al. | |
| 6,907,206 B2 | 6/2005 | Hattori et al. | |
| 6,985,677 B2 | 1/2006 | Yamagata et al. | |
| 7,040,732 B2 | 5/2006 | Dudek | |
| 7,403,741 B2 * | 7/2008 | Yoshihara et al. | 399/411 |

(Continued)

FOREIGN PATENT DOCUMENTS

JP A 60-37574 2/1985

(Continued)

*Primary Examiner*—David M Gray
*Assistant Examiner*—Joseph S Wong
(74) *Attorney, Agent, or Firm*—Oliff & Berridge, PLC

(57) ABSTRACT

A low-voltage power source circuit board is provided downstream in relation to the flow of air introduced through an intake hole and exhausted by a power source fan. Heat sinks are provided on the low-voltage power source circuit board on electronic parts that generate a large amount of heat, the plate surfaces of the heat sinks being arranged along the direction of airflow, thereby minimizing their resistance to the airflow. Air including heat generated from these electronic parts is exhausted by the power source fan without the air heating the high-voltage power source circuit board or engine circuit board that are disposed upstream in relation to the direction of airflow.

11 Claims, 12 Drawing Sheets

U.S. PATENT DOCUMENTS

2003/0219274 A1    11/2003    Hirose et al.

FOREIGN PATENT DOCUMENTS

| JP | A 3-105366 | 5/1991 |
| --- | --- | --- |
| JP | A 6-067503 | 3/1994 |
| JP | A 08-22237 | 1/1996 |
| JP | A 9-325671 | 12/1997 |
| JP | A 10-143053 | 5/1998 |
| JP | A 11-311935 | 11/1999 |
| JP | A 11-338332 | 12/1999 |
| JP | A 2001-92205 | 4/2001 |
| JP | A 2002-189320 | 7/2002 |

\* cited by examiner

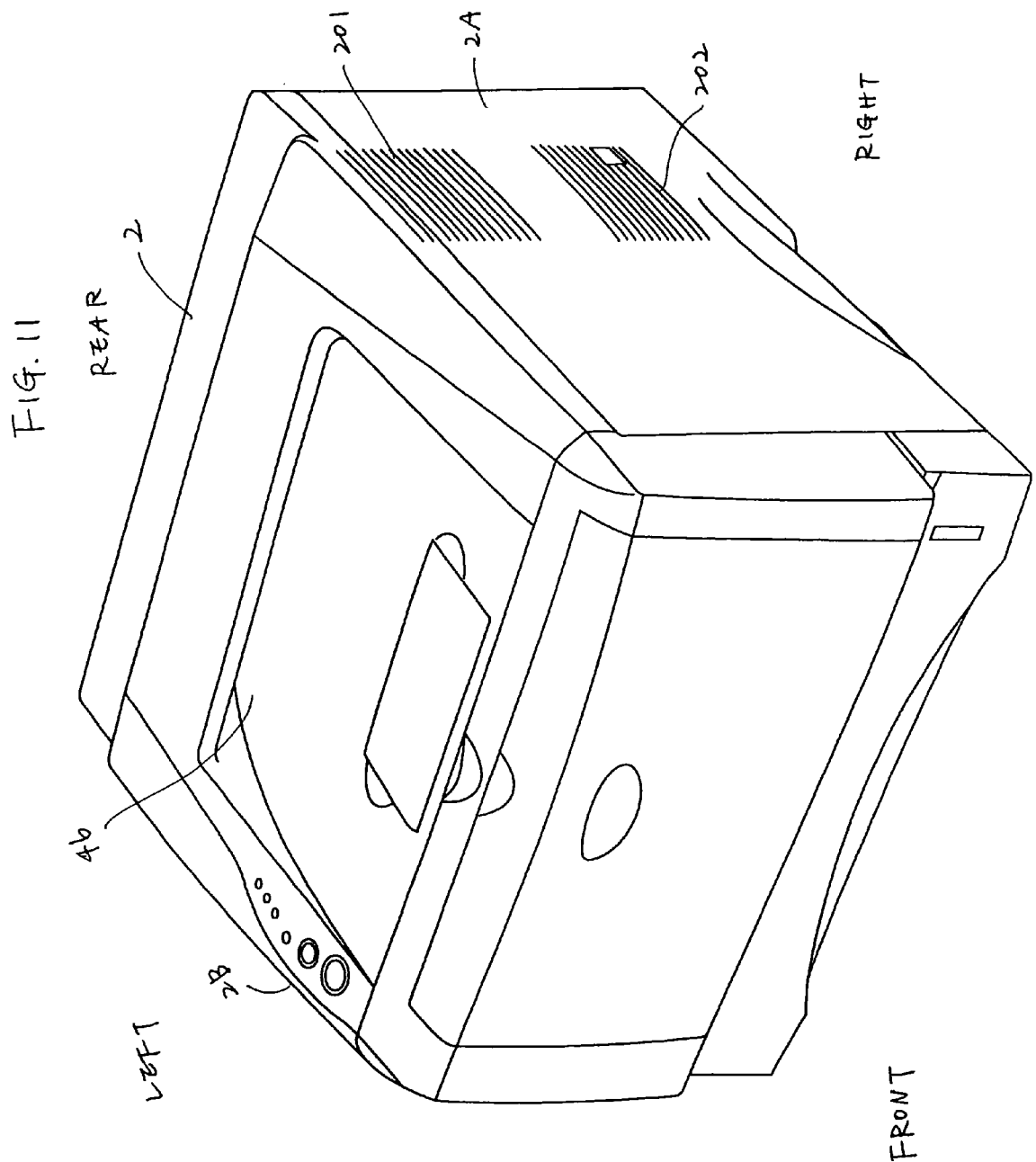

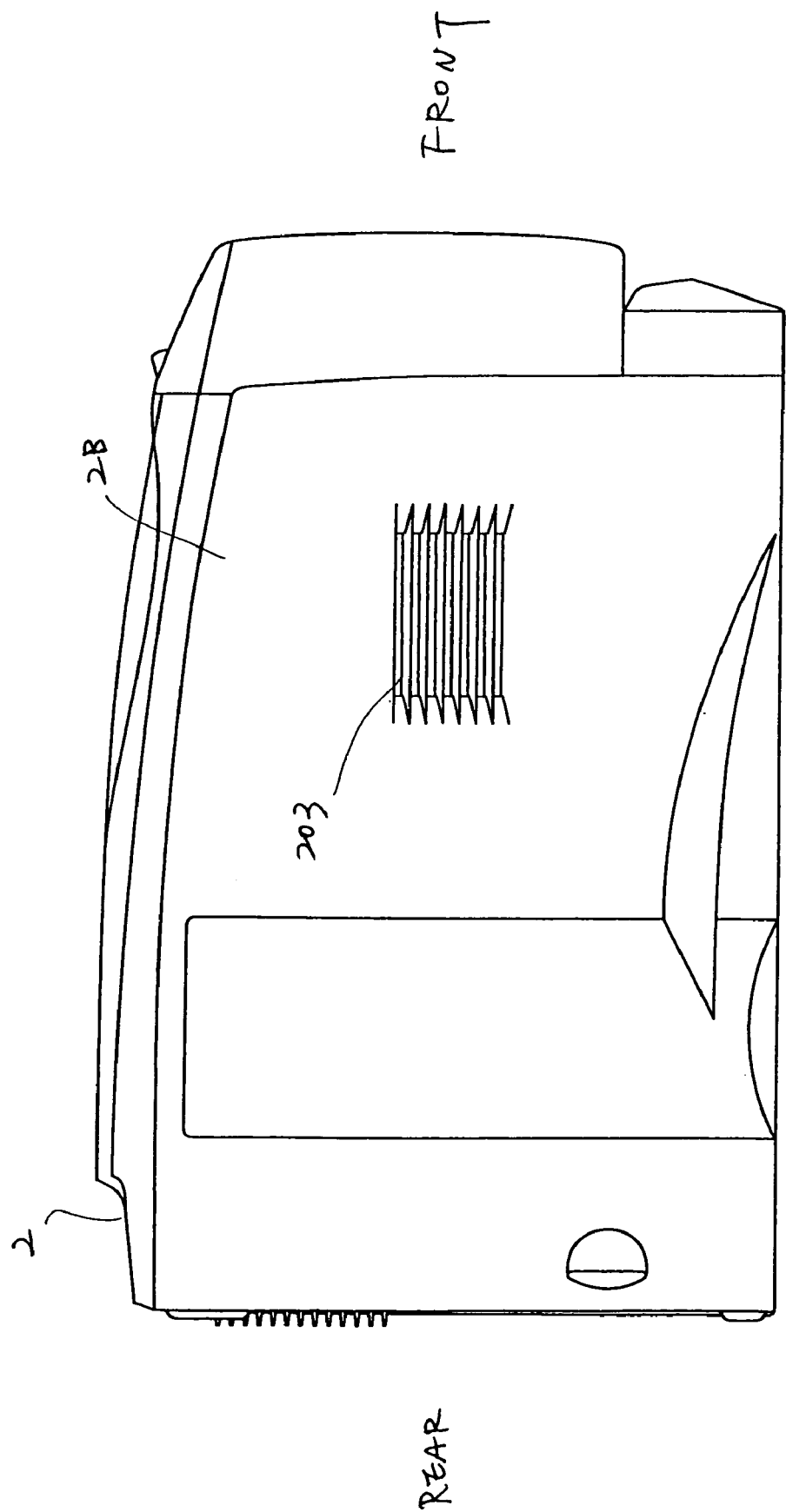

EXHAUST SYSTEM OF IMAGE FORMING DEVICE

This is a Divisional of application Ser. No. 10/643,216 filed Aug. 19, 2003. The disclosure of the prior application is hereby incorporated by reference herein in its entirety.

BACKGROUND OF THE INVENTION

1. Field of the Invention

The present invention relates to an image forming device capable of exhausting air that contains heat generated by a power source circuit board from a main casing of the image forming device so as not to affect other circuit boards.

2. Description of the Related Art

Conventional image forming devices, such as laser printers and copy machines, have a photosensitive member with a charge generating layer and a charge transporting layer formed over a base layer. A charge is applied to the photosensitive member by performing a corona discharge, and the charged photosensitive member is exposed to light, such as laser light or LED light, to form an electrostatic latent image. After the latent image is developed with toner or another developer, the developed image is transferred onto a recording medium. The image formation is completed when the image is fixed onto the recording medium by applying heat from a fixing unit or the like. Heat that is generated from a power source circuit board and the like for supplying drive voltages to devices used to form the image is exhausted from the main casing by fans.

However, along with the recent trend of manufacturing smaller, quieter image forming devices, the number of fans mounted in the image forming device is decreased, reducing the efficiency of cooling the power source circuit board. Further, when the power source circuit board is disposed near other circuit boards, other components, or the like, heat generated from the power source circuit board is transferred to the other circuit boards, other components, and the like, causing problems in image formation.

SUMMARY OF THE INVENTION

In view of the foregoing, it is an object of the present invention to overcome the above problems, and also to provide an image forming device that effectively uses the limited space in the main casing and is capable of discharging air including heat generated from the power source circuit board from the main casing so as not to affect the other circuit boards.

In order to attain the above and other objects, the present invention provides an image forming device including a main casing having a first surface and a second surface opposing the first surface, a processing unit that is detachably mounted in the main casing and that forms images on a recording medium, a power source circuit board disposed below inside the main casing and outputting a drive voltage to the processing unit, and a high-voltage power source circuit board disposed inside the main casing. The high-voltage power source circuit board outputs a drive voltage at a higher voltage than the drive voltage outputted by the power source circuit board. The components of the power source circuit board generate larger amount of heat than the high-voltage power source circuit board. The first surface is formed with a first exhaust outlet exhausting air from the main casing. The power source circuit board is disposed downstream of the high-voltage power source circuit board in an air passage direction in which the air passes through the main casing and is discharged through the first exhaust outlet.

There is also provided an image forming device including a main casing having a first surface and a second surface opposing the first surface, a processing unit that is detachably mounted in the main casing and that forms images on a recording medium, and a power source circuit board disposed inside the main casing for outputting a drive voltage to drive the processing unit. The first surface of the main casing is formed with a first exhaust outlet for exhausting air from the main casing. The power source circuit board is disposed near the first exhaust outlet.

BRIEF DESCRIPTION OF THE DRAWINGS

In the drawings:

FIG. 6 is a perspective view showing an exhaust passage, including a chute, circuit boards, and the like;

FIG. 11 is a perspective view of a main case body of the laser printer; and

FIG. 12 is a left-side view of the main case body.

PREFERRED EMBODIMENT OF THE PRESENT INVENTION

A laser printer 1 according to an embodiment of the present invention will be described with reference to the accompanying drawings. It should be noted that, in FIGS. 2 to 6, directions −Z, −X, +X, +Z, +Y, and −Y indicate frontward, leftward, rightward, rearward, upward, and downward directions, respectively, of the laser printer 1. First, overall structure of the laser printer 1 will be described with reference to FIG. 1.

Figure 1:
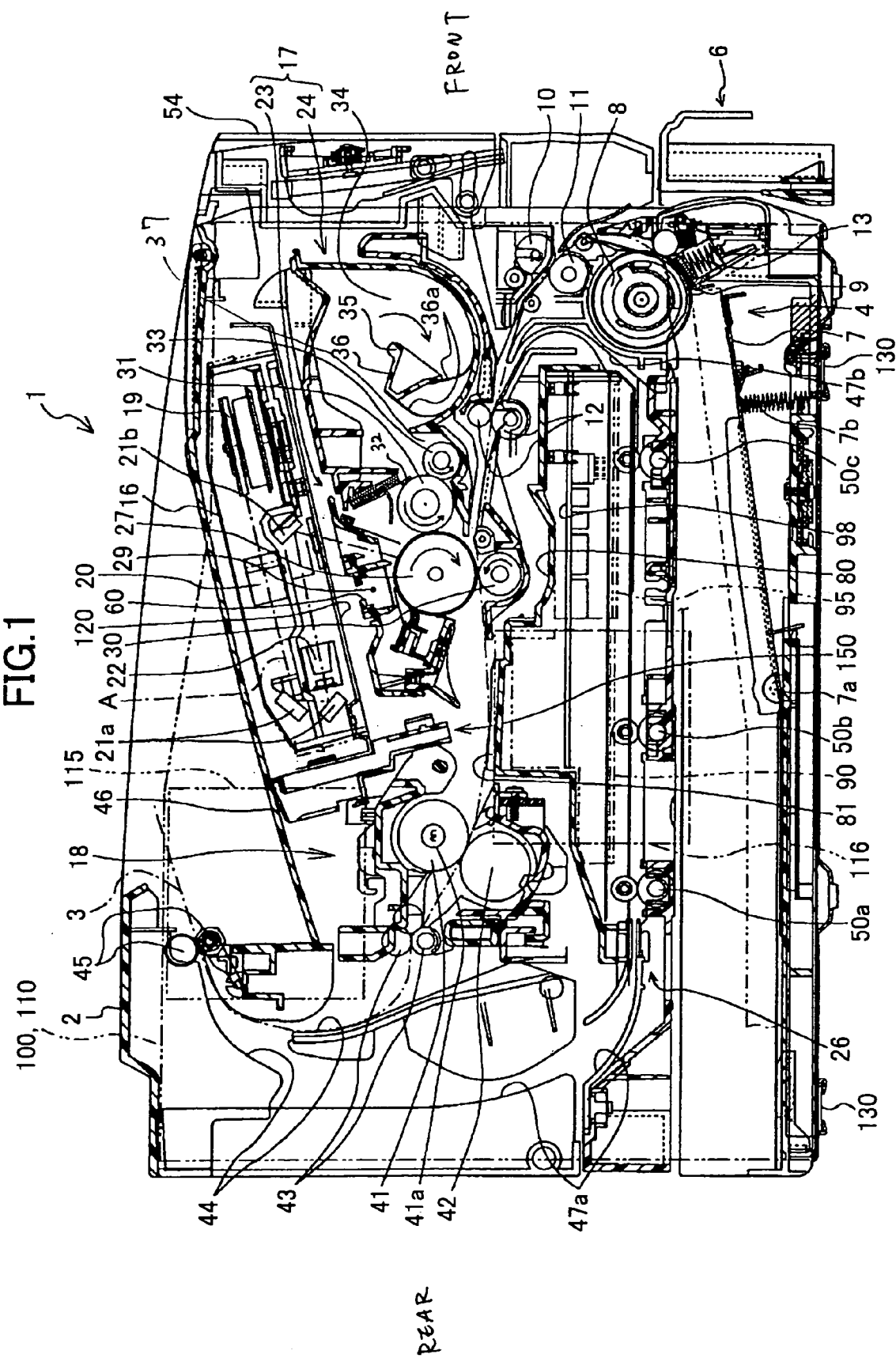
FIG. 1 is a central cross-sectional view showing a laser printer according to a preferred embodiment of the present invention.

As shown in FIG. 1, the laser printer 1 includes a feeder section 4, an image forming section, and a duplex printing unit 26, all accommodated in a main body case 2. The feeder section 4 is for feeding a sheet 3. The image forming section is for forming a predetermined image on the fed sheet 3, and includes a scanner unit 16, a process cartridge 17, and a fixing unit 18.

The process cartridge 17 is housed in a space provided close to the front upper surface of the main body case 2. The space is covered by a cover 54, which is provided on the front side of the main body case 2 so as to be pivotable downward. The process cartridge 17 is inserted and removed where the cover 54 is opened widely. The fixing unit 18 is disposed downstream from the process cartridge 17 with respect to a sheet feed direction of the sheet 3, on a rear end side in a lower part of the main body case 2.

As shown in FIGS. 11 and 12, the main body case 2 has a right side surface 2A and a left side surface 2B. The right side surface 2A is formed with exhaust outlets 201 and 202, and the left side surface 2B is formed with an intake hole 203. A sheet delivery tray 46 is located at the upper center surface of the main case body 2, slanting upward to form a recessed shape. Printed sheets 3 are discharged from the main case body 2 into the stack on the tray 46.

As shown in FIG. 1, a sheet delivery path 44 is provided at the rear part in the main body case 2. The sheet delivery path 44 is formed in a semi-arc shape that extends vertically along the back of the main body case 2. The sheet delivery path 44 delivers the sheet 3 from the fixing unit 18 to the sheet delivery tray 46. Sheet delivery rollers 45 for conveying the sheet 3 are provided along the sheet delivery path 44.

The feeder section 4 will be described in detail. The feeder section 4 includes a sheet feed tray 6, a sheet feed roller 8, a sheet pressing plate 7, a separation pad 9, a paper powder removing roller 10, a conveying roller 11, and registration rollers 12. The sheet feed tray 6 is detachably mounted on the front side of the main body case 2. The sheet feed tray 6 is pulled forward to remove the sheet feed tray 6 from the main body case 2 and pushed rearward to mount onto the main body case 2.

The sheet feed roller 8 is provided in a bottom part of the main body case 2. The sheet pressing plate 7 is provided in the sheet feed tray 6, and the sheets 3 are stacked on the sheet pressing plate 7. The sheet pressing plate 7 is pivotable about a shaft 7a, which is supported by the bottom surface of the sheet feed tray 6 at the rear end of the sheet pressing plate 7, such that the front end of the sheet pressing plate 7 moves upward and downward. Also, the sheet pressing plate 7 is biased toward the sheet feed roller 8 by a spring 7b from its under surface. The sheet pressing plate 7 pivots downward against the biasing force of the spring 7b by an amount proportional to the stacked quantity of sheets 3, and the sheets 3 are pressed into contact with the sheet feed roller 8.

The separation pad 9 is disposed in confrontation with the sheet feed roller 8 and pressed toward the sheet feed roller 8 by a spring 13 disposed on the back of the separation pad 9. The separation pad 9 nips and conveys the sheets 3 one at a time in cooperation with the sheet feed roller 8 at the time of sheet feed.

The conveying roller 11 is provided downstream from the sheet feed roller 8 with respect to the sheet feed direction. The conveying roller 11 performs conveyance of the sheets 3. The paper powder removing roller 10 is in contact with the conveying roller 11 with the sheet 3 therebetween to remove paper powder from the sheet 3 and also conveys the sheet 3 in cooperation with the conveying roller 11. The registration rollers 12 are provided downstream from the conveying roller 11 with respect to the sheet feed direction for adjusting timing for delivering the sheet 3 at the time of printing.

Next, the scanner unit 16 will be described in detail. The scanner unit 16 includes a laser beam emitting section (not shown), a polygon mirror 19, a fθ lens 20, reflecting mirrors 21a, 21b, and a relay lens 22. The laser beam emitting section is located right below the sheet delivery tray 46 and irradiates a laser beam. The polygon mirror 19 rotates to scan the laser beam from the laser beam emitting section in a main scanning direction across the surface of a photosensitive drum 27 (described later). The fθ lens 20 is for stabilizing scanning speed of the laser beam reflected from the polygon mirror 19. The reflecting mirrors 21a, 21b are for reflecting the laser beam. The relay lens 22 is for adjusting the focal position in order to focus the laser beam from the reflecting mirror 21 onto the photosensitive drum 27. With this configuration, the laser beam is irradiated from the laser beam emitting section based on image data and passes through or is reflected by the polygon mirror 19, the fθ lens 20, the reflecting mirrors 21a, the relay lens 22, and the reflection mirror 21b in this order as indicated by an alternate long and dash lines A in FIG. 1 to expose and scan the surface of the photosensitive drum 27.

Next, the process cartridge 17 will be described. The process cartridge 17 includes a drum cartridge 23 and a developing cartridge 24 that is detachably mounted on the drum cartridge 23. The drum cartridge 23 includes the photosensitive drum 27, a Scorotron charger 29, and a transfer roller 30. The developing cartridge 24 includes a developing roller 31, a supply roller 33, a toner hopper 34, and a developing chamber 37. A layer thickness control blade 32 and an agitator 36 are disposed within the developing chamber 37 and the toner hopper 34, respectively.

The photosensitive drum 27 is arranged in contact with the developing roller 31 and rotatable clockwise as indicated by an arrow in FIG. 1. The photosensitive drum 27 includes positively charging organic photo conductor coated on a conductive base material. The positively charging organic photo conductor is made from a charge transfer layer dispersed with a charge generation material on a charge generation layer. When the photosensitive drum 27 is exposed by a laser beam, the charge generation material absorbs the light and generates a charge. The charge is transferred onto the surface of the photosensitive drum 27 and the conductive base material through the charge transfer layer and counteracts the surface potential charged by the Scorotron charger 29. As a result, a potential difference is generated between regions of the photosensitive drum 27 that were exposed and regions that were not exposed by the laser light. By selectively exposing and scanning the surface of the photosensitive drum 27 with a laser beam based upon image data, an electrostatic latent image is formed on the photosensitive drum 27.

The Scorotron charger 29 is disposed above the photosensitive drum 27 at a position separated from the photosensitive drum 27 by a predetermined distance. The Scorotron charger 29 generates a corona discharge from a tungsten wire, for example, and is turned ON by a charging bias circuit unit (not shown) of a high-voltage power source circuit board 95 (described later) to positively charge the surface of the photosensitive drum 27 to a uniform charge.

An opening 60 in fluid communication with the external air is formed in the top surface of a casing of the processing cartridge 17, near the area in which the Scorotron charger 29 is provided. Ozone and other products generated during the charging process can be discharged from the processing cartridge 17 via the opening 60.

The developing roller 31 is disposed further downstream than the Scorotron charger 29 with respect to the rotation direction of the photosensitive drum 27. The developing roller 31 is rotatable counterclockwise as indicated by an arrow in FIG. 1. The developing roller 31 includes a roller shaft made from metal coated with a roller made from a conductive rubber material. A development bias is applied to the developing roller 31 from a development bias circuit unit (not shown) of the high-voltage power source circuit board 95.

The supply roller 33 is rotatably disposed beside the developing roller 31 on the opposite side from the photosensitive drum 27 across the developing roller 31. The supply roller 33 is in pressed contact with the developing roller 31. The supply roller 33 is rotatable counterclockwise as indicated by an arrow in FIG. 1, which is the same rotation direction as the developing roller 31. The supply roller 33 includes a roller shaft made of metal coated with a roller made of a conductive foam material and charges toner supplied to the developing roller 31 by friction.

The toner hopper 34 is provided beside the supply roller 33 and filled with developer, which is to be supplied to the developing roller 31 by the supply roller 33. In this embodiment, non-magnetic, positive-charging, single-component toner is used as a developer. The toner is a polymeric toner obtained by copolymerizing polymeric monomers using a well-known polymerization method, such as suspending polymerization. Examples of polymeric monomers include styrene monomers and acrylic monomers. Styrene is an example of a styrene monomer. Examples of acrylic monomers include acrylic acid, alkyl (C1 to C4) acrylate, and alkyl (C1 to C4) methacrylate. A coloring agent such as carbon black, wax, and the like are mixed in the polymeric toner. An externally added agent such as silica is also added in order to improve fluidity. A particle diameter of the polymeric toner is approximately 6 to 10 μm.

The agitator 36 has a coarse mesh-like plate shape extending in the axial direction (the near-to-far direction in the drawing) and has a bend in the middle when viewed as a cross-section. A rotating shaft 35 is disposed on one end of the agitator 36, and film members 36a are provided on the other end of the agitator 36 and in the bend in the middle of the agitator 36 for scraping the inner wall of the toner hopper 34. The rotating shaft 35 is rotatably supported in the center of both lengthwise ends of the toner hopper 34 and, hence, supports the agitator 36. When the agitator 36 is rotated in the direction indicated by the arrow, toner accommodated in the toner hopper 34 is agitated and supplied into the developing chamber 37.

The transfer roller 30 is disposed below the photosensitive drum 27 and downstream from the developing roller 31 with respect to the rotating direction of the photosensitive drum 27. The transfer roller 30 is rotatable counterclockwise as indicated by an arrow in FIG. 1. The transfer roller 30 includes a metal roller shaft coated with a roller made from an ion-conductive rubber material. During the transfer process, a transfer bias circuit unit (not shown) of the high-voltage power source circuit board 95 applies a transfer forward bias to the transfer roller 30. The transfer forward bias generates a potential difference between the surfaces of the photosensitive drum 27 and the transfer roller 30. The potential difference electrically attracts toner that electrostatically clings to the surface of the photosensitive drum 27 to the surface of the transfer roller 30.

Next, the fixing unit 18 will be described. The fixing unit 18 includes a heating roller 41, a pressing roller 42 for pressing the heating roller 41, and a pair of conveying rollers 43. The conveying rollers 43 are provided downstream from the heating roller 41 and the pressing roller 42. The heating roller 41 is formed by coating a hollow aluminum roller with a fluorocarbon resin and sintering the assembly. The heating roller 41 includes a metal tube and a halogen lamp 41a for heating inside the metal tube. The pressing roller 42 includes a silicon rubber shaft having low hardness that is covered by a tube formed of a fluorocarbon resin. The silicon rubber shaft is urged upward by a spring (not shown), pressing the pressing roller 42 against the heating roller 41. While the sheet 3 from the process cartridge 17 passes between the heating roller 41 and the pressing roller 42, the heating roller 41 pressurizes and heats toner that was transferred onto the sheet 3 in the process cartridge 17, thereby fixing the toner onto the sheet 3. Afterward, the sheet 3 is transported to the sheet delivery path 44 by the conveying rollers 43.

Next, the duplex printing unit 26 will be described. The duplex printing unit 26 is disposed above the paper supply cassette 6 and includes reverse conveying rollers 50a, 50b, and 50c arranged in a substantially horizontal orientation. A reverse conveying path 47a is provided on the rear side of the reverse conveying roller 50a, while a reverse conveying path 47b is provided on the front side of the reverse conveying roller 50c. The reverse conveying path 47a extends from the discharge roller 45 to the reverse conveying rollers 50a and branches off from the discharge path 44 near the end of the same in the sheet feed direction of the paper 3. The reverse conveying path 47b, on the other hand, extends from the reverse conveying roller 50c to the register rollers 12.

When performing duplex printing, an image is first formed on one side of the paper 3, after which a portion of the paper 3 is discharged onto the discharge tray 46. When the trailing edge of the paper 3 becomes interposed between the discharge rollers 45, the discharge rollers 45 stop rotating forward and begin rotating in reverse. At this time, the trailing edge of the paper 3 contacts the arcuate surface of the discharge path 44 and is guided along this surface to the reverse conveying path 47a, without returning to the discharge path 44. The paper 3 is conveyed from the reverse conveying path 47a to the reverse conveying rollers 50a, 50b, and 50c and is subsequently guided to the register rollers 12 along the reverse conveying path 47b. According to this operation, the paper 3 is conveyed to the image forming unit with its front and back surfaces switched in order to form a prescribed image on the other side of the paper 3.

Figure 2:
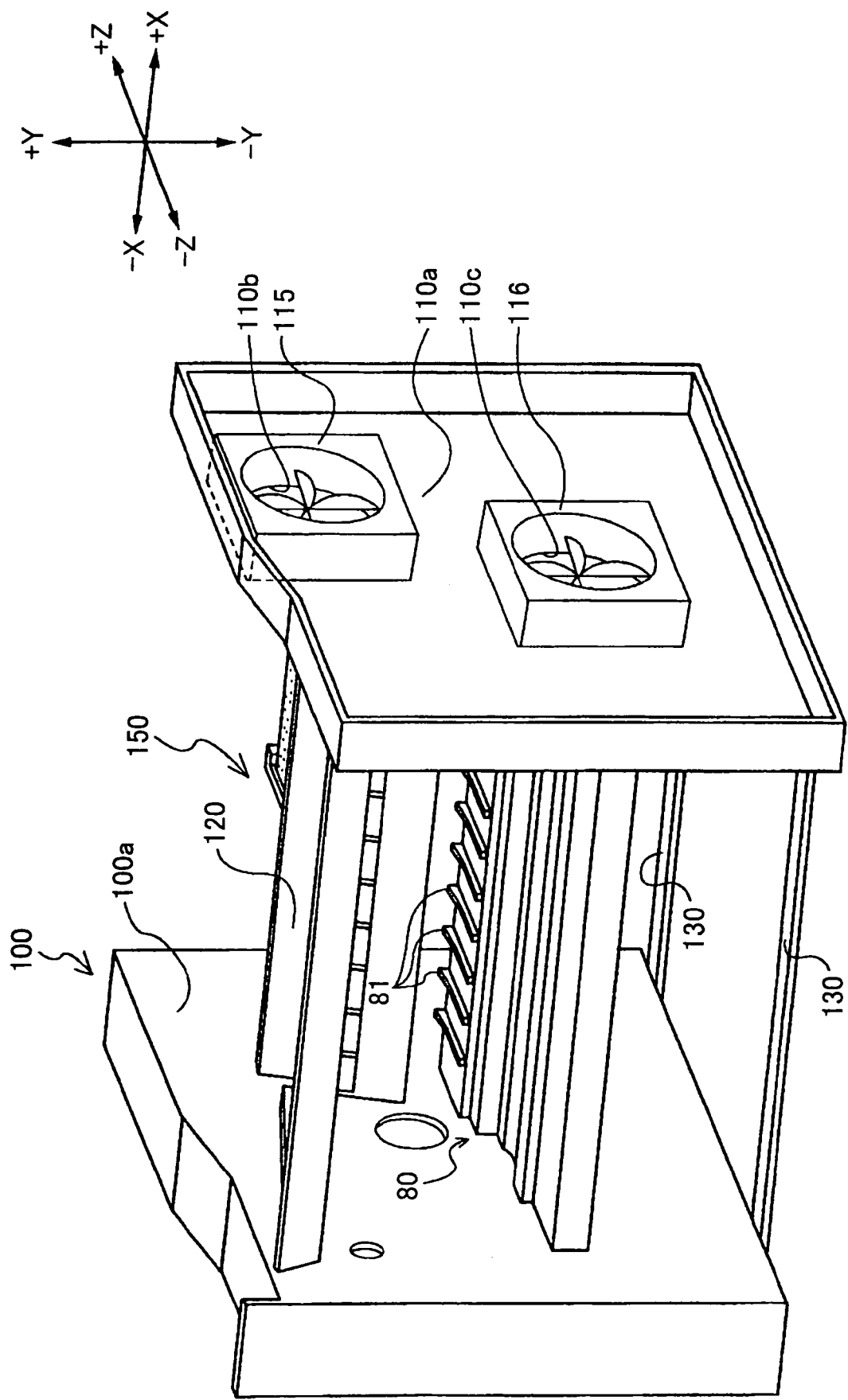
FIG. 2 is a perspective view showing the left and right frames of the laser printer in FIG. 1 from the front right.

A low-voltage power source circuit board 90, the high-voltage power source circuit board 95, and an engine circuit board 98 are provided between the duplex printing unit 26 and the image forming unit. A chute 80 is disposed between these circuit boards 90, 95, and 98 and the image forming unit for separating these circuit boards 90, 95, 98 from the fixing unit 18, the processing cartridge 17, and other devices. The chute 80 is formed of a resinous material. As shown in FIG. 2, a plurality of guide plates 81 extending in the sheet feed direction (direction Z) are arranged in a row along the direction X on the top surface of the chute 80, constructing a portion of the conveying path for the paper 3.

The low-voltage power source circuit board 90 functions to drop the voltage supplied from a source external to the laser printer 1, such as a single-phase 100V source, to a voltage of 24V, for example, to be supplied to components in the laser printer 1. The high-voltage power source circuit board 95 generates a high-voltage bias that is applied to components in the processing cartridge 17. The engine circuit board 98 drives a DC motor 75 (FIG. 4), which is the source for driving parts involved in mechanical operations, such as the rollers in the laser printer 1, a solenoid (not shown) for switching the operating direction of this drive system, and the like. A relatively large current is required to drive the DC motor 75, the solenoid, and the like. The electronic parts provided on the engine circuit board 98 for controlling this current generate a large amount of heat.

Figure 5:
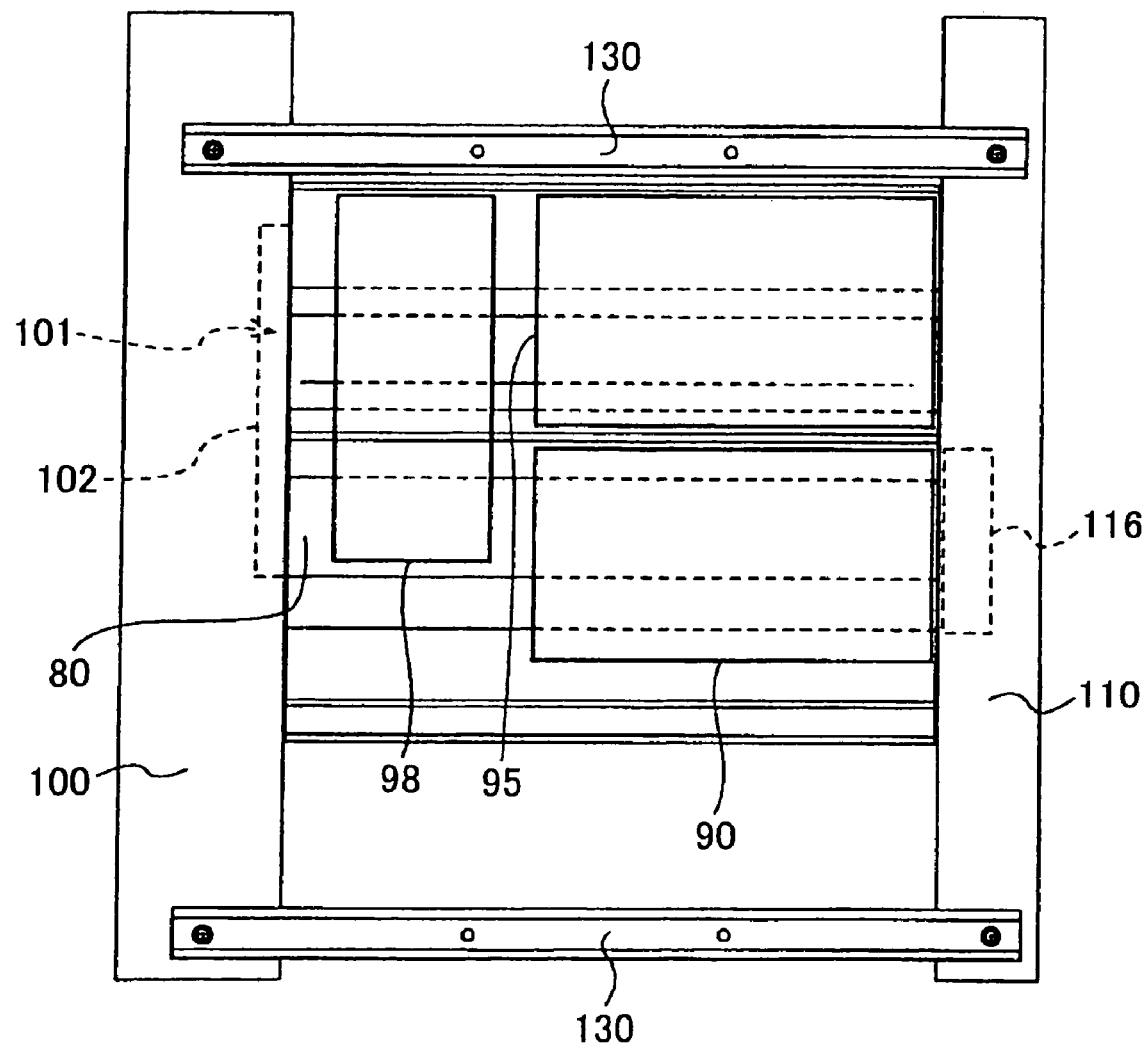
FIG. 5 is a bottom view showing the left and right frames.

The electronic parts in the circuit boards 90, 95, and 98 are disposed on one side surface of the same. As shown in FIG. 5, the low-voltage power source circuit board 90 and the high-voltage power source circuit board 95 are disposed beneath the chute 80 near a right frame 110 (described next), with the surfaces on which electronic parts are mounted facing upward. The engine circuit board 98 is disposed beneath the chute 80 near a left frame 100 (described next), with the surface on which electronic parts are mounted facing downward.

As shown in FIG. 1, a left frame 100 and a right frame 110 are provided in the main body case 2 for supporting various components, including the paper supply cassette 6, the scanning unit 16, the processing cartridge 17, and the fixing unit 18. As shown in FIG. 2, the left and right frames 100 and 110 each have a box shape formed of resinous plate surfaces 100a and 110a substantially rectangular in shape and four edges of the plate surfaces 100a and 110a all bent in a common direction that is perpendicular in relation to the plate surfaces 100a and 110a. The left and right frames 100 and 110 are disposed such that the surfaces of the plate surfaces 100a and 110a oppose each other with the shorter dimension of the plate surfaces 100a and 110a arranged vertically in the laser printer 1 and the open side of the box-shaped left and right frames 100 and 110 facing outward. A steel tray 120, the chute 80, and two steel underbars 130 span between the left and right frames 100 and 110. The steel tray 120 is for supporting the scanning unit 16.

Two exhaust outlets 110b and 110c are formed in the plate surface 110a at positions confronting the corresponding exhaust outlets 201 and 202 formed in the right side surface 2A of the main body case 2 shown in FIG. 11. A main fan 115 and a power source fan 116 are provided in these exhaust outlets 110b and 110c, respectively, such that the main fan 115 and the power source fan 116 are disposed between the exhaust outlets 110b, 110c and the exhaust outlets 201, 202, respectively. With this configuration, the main fan 115 and the power source fan 116 exhaust air from the main body case 2 through the exhaust outlets 110b, 110c, 201, and 202.

Figure 6:
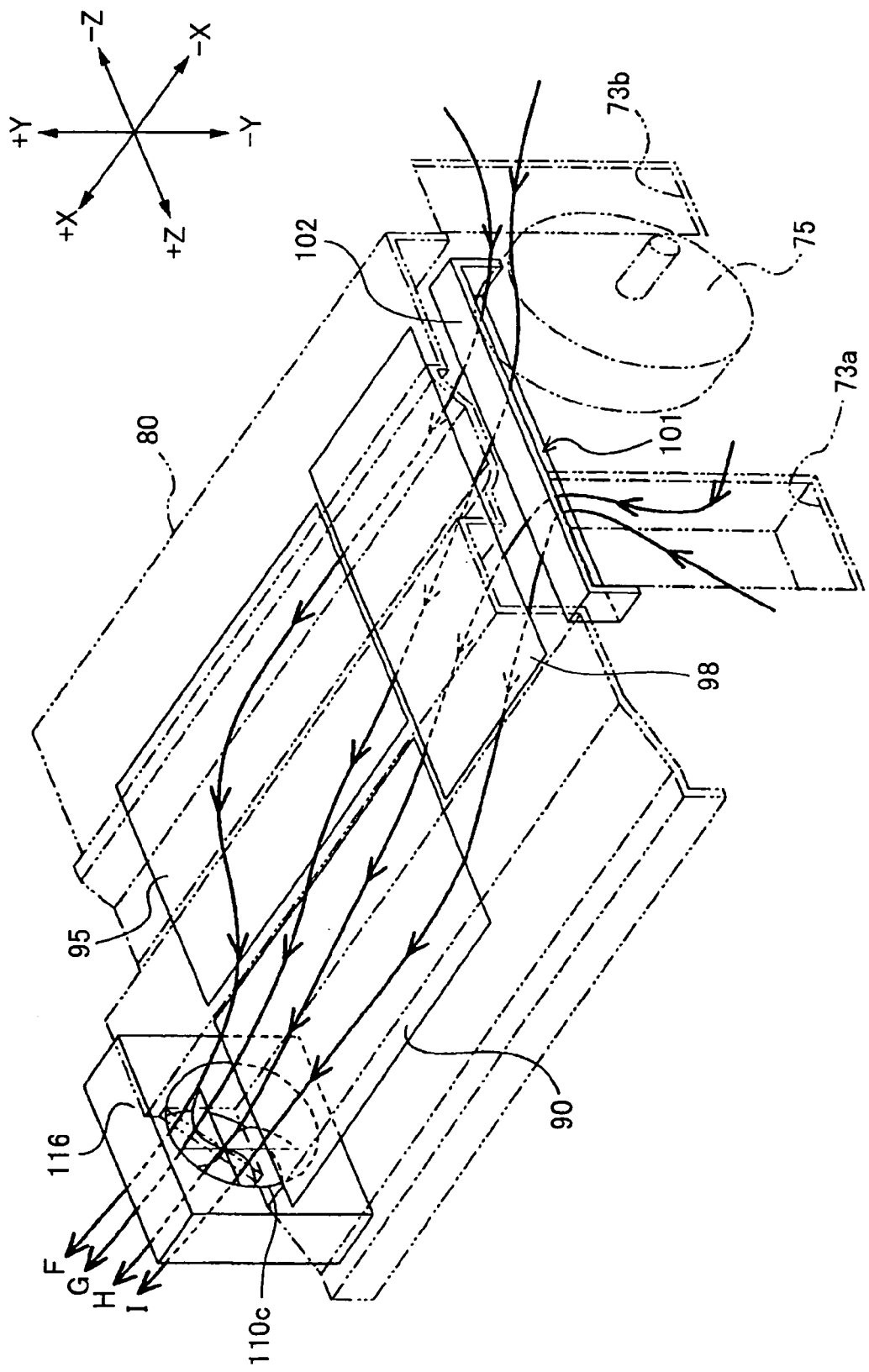
Figure 9:
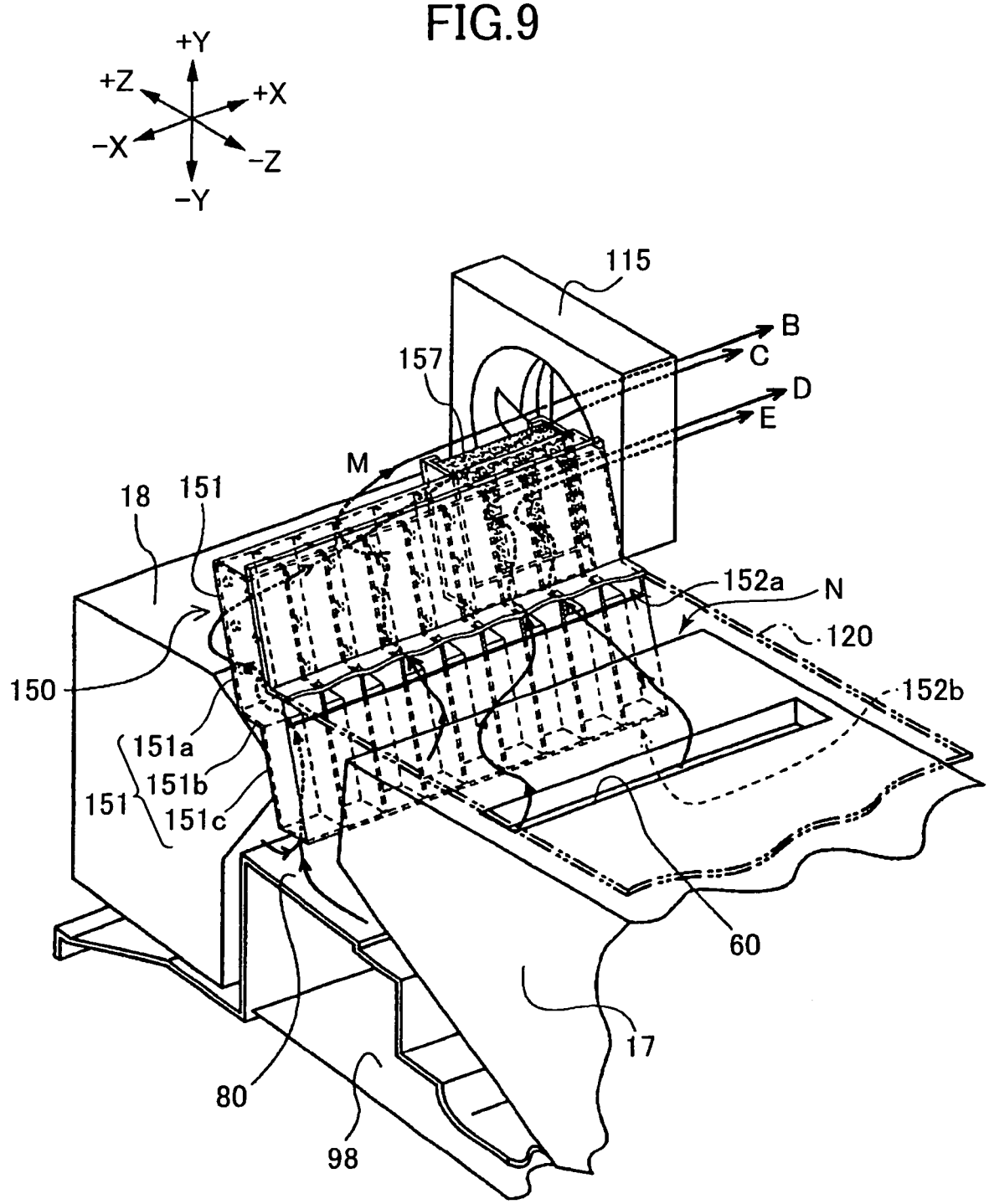
FIG. 9 is a perspective view showing channels of air around the duct.

As shown in FIGS. 1 and 9, the main fan 115 is positioned above the fixing unit 18 nearer to the fixing unit 18 than to the processing cartridge 17. As shown in FIGS. 1 and 6, the power source fan 116 is disposed below the chute 80 closer to the low-voltage power source circuit board 90 than to the high-voltage power source circuit board 95.

Figure 3:
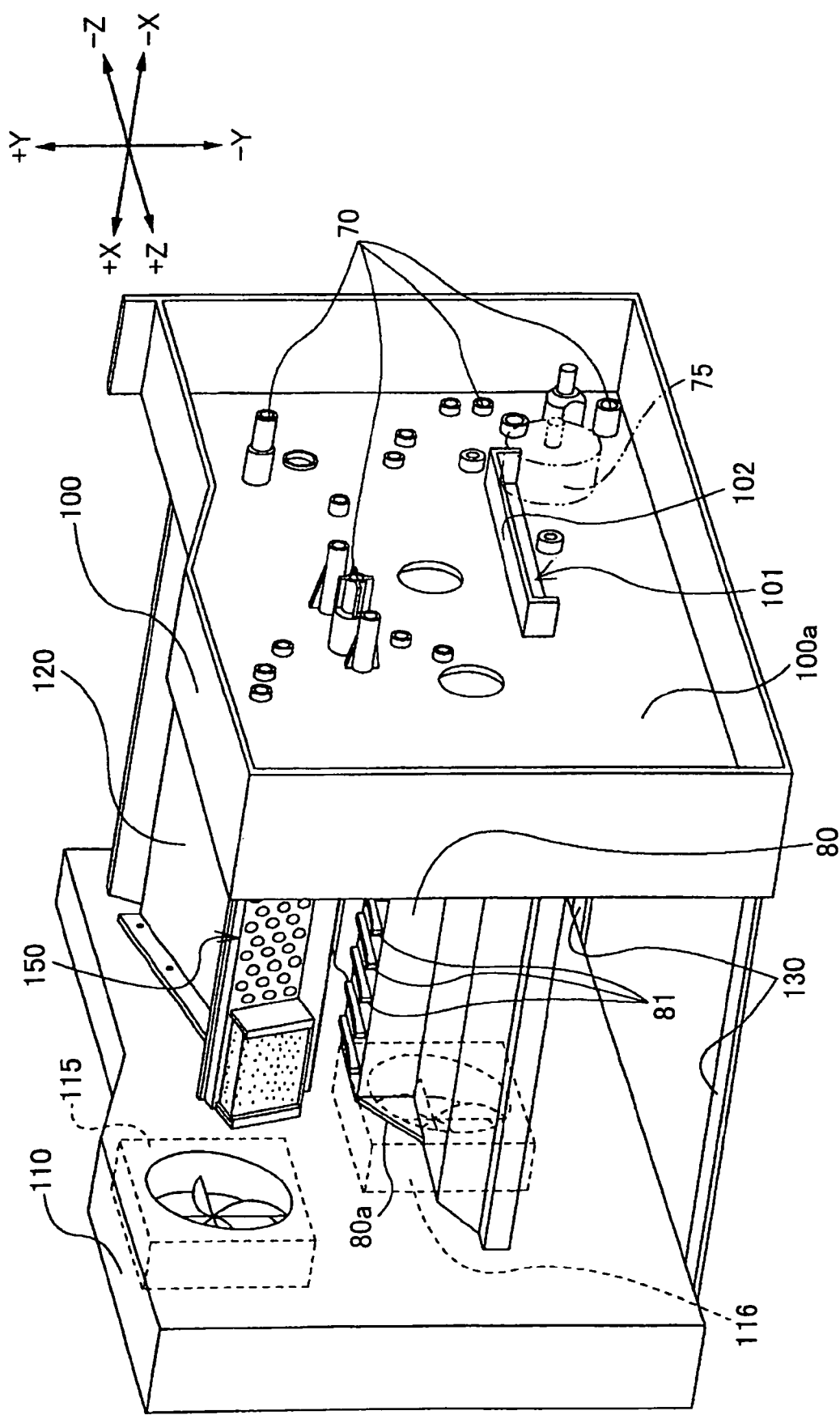
FIG. 3 is a perspective view showing the left and right frames from the back left.

As shown in FIG. 3, a plurality of bearings 70 are provided on the plate surface 100a. Gears 71 shown in FIG. 4 and a cam (not shown) engage with these bearings 70. A drive system 72 (FIG. 4) is constructed of these gears 71 and the cam and serves to rotate various rollers in the processing cartridge 17, the fixing unit 18, and the like.

The left frame 100 is formed with an intake hole 101 rectangular in shape and extending in the front-to-back direction (direction Z) at a position slightly below the center of the left frame 100. A hood 102 is provided above and on the sides of the intake hole 101, restricting the direction in which air passes through among the gears 71 of the drive system 72 and flows through the intake hole 101.

The DC motor 75 is positioned below the drive system 72, opposing the front portion of the intake hole 101. The DC motor 75 is for activating the drive system 72 (FIG. 4) to drive the rollers to rotate when a drive voltage is applied by the engine circuit board 98.

Figure 4:
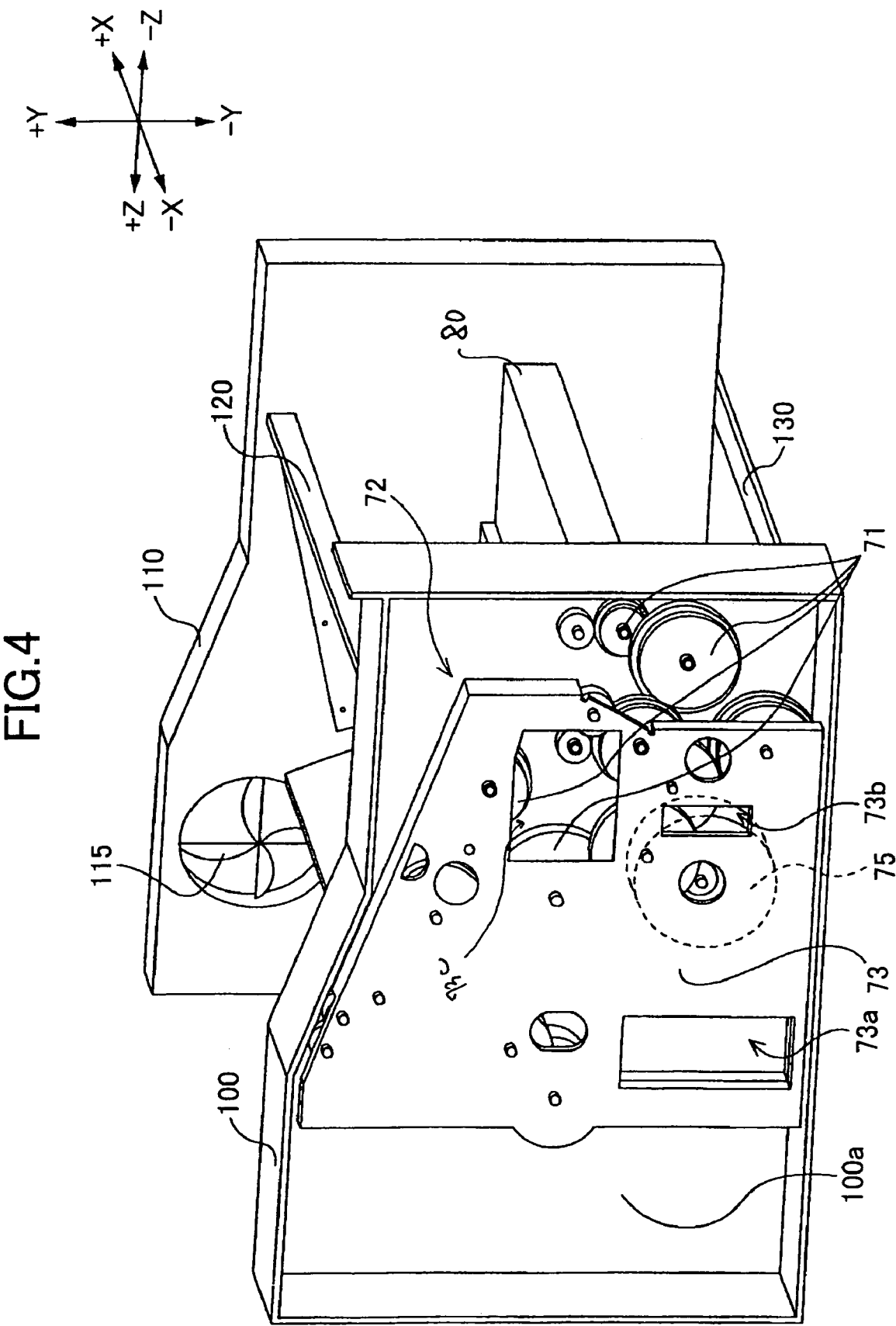
FIG. 4 is a perspective view showing the left and right frames from the front left.

As shown in FIG. 4, a support plate 73 is fixed to the left frame 100 for covering the drive system 72 and for preventing the plurality of gears 71 from coming off the bearings 70. Air passage openings 73a and 73b are formed in the support plate 73 at positions on both sides of the DC motor 75 in the front-to-back direction (Z direction). With the air passage openings 73a and 73b and the hood 102 described above, the DC motor 75 can be positioned in the air path for air passing through the gears 71 and through the intake hole 101. An air passage opening 73c is also formed in the support plate 73 at a position corresponding to the intake hole 203 formed in the left side surface 2B of the main body case 2 shown in FIG. 12. With this configuration, air is introduced into the main body case 2 through the intake hole 203 of the main body case 2 and flows through the air passage openings 73a, 73b, 73c of the support plate 73 and the intake hole 101 of the left frame 100.

The tray 120 is a steel plate substantially rectangular in shape that is given a tray-shape by bending both edges in the shorter direction Z upward to a direction substantially vertical (approximately the direction Y). The scanning unit 16 is fixed on top of the tray 120. Both ends of the tray 120 in the longer direction X are also bent in the direction Y and are parallel to the bottom surfaces of the frames 100 and 110. These bent ends are fixed to each of the left and right frames 100 and 110.

The steel underbars 130 are narrow steel plates. As shown in FIG. 5, the steel underbars 130 are slightly longer than the tray 120 in the direction X. As shown in FIG. 1, both edges of each of the steel underbars 130 in the direction Z are folded over toward the center of the steel underbars 130 to increase the strength of the steel underbars 130 for resisting bends in the direction X. As shown in FIG. 5, the two steel underbars 130 bridge the left frame 100 and the right frame 110 parallel to one another and are positioned one in the front section of the laser printer 1 and one in the rear section of the laser printer 1. Both lengthwise ends of the steel underbars 130 are fixed to the bottom surfaces of the frames 100 and 110.

As shown in FIG. 3, the chute 80 is formed of resin to a width equivalent to the interval between the left frame 100 and the right frame 110. As described above, the chute 80 protects the low-voltage power source circuit board 90, the high-voltage power source circuit board 95, and the like provided between the left frame 100 and the right frame 110 by separating these components from the fixing unit 18 and the processing cartridge 17 disposed thereabove.

As shown in FIG. 6, space surrounded by the circuit boards 90, 95, and 98, the chute 80, and a steel plate (not shown) disposed beneath the engine circuit board 98 serves as an exhaust passage. Specifically, the space surrounded by the chute 80 on the top (direction +Y) and the left and right (direction Z) and by the low-voltage power source circuit board 90 and the high-voltage power source circuit board 95 on the bottom, and the space surrounded by the engine circuit board 98 on the top, the steel plate on the bottom, and the chute 80 on the left and right, function as the exhaust passage. The left and right frames 100 and 110 (FIG. 3) cover the front and back ends of the exhaust passage (direction X). The exhaust passage is in fluid communication with the outside air via the intake hole 101 and the exhaust outlet 110c formed in the left and right frames 100 and 110.

In the present embodiment, a portion of the power source fan 116 is disposed outside the exhaust passage, as shown in FIG. 3. Therefore, a regulating plate 80a is provided for blocking off the portion of the power source fan 116 disposed outside the exhaust passage. This construction increases the exhausting efficiency since the power source fan 116 only exhausts air through the exhaust passage.

Figure 7:
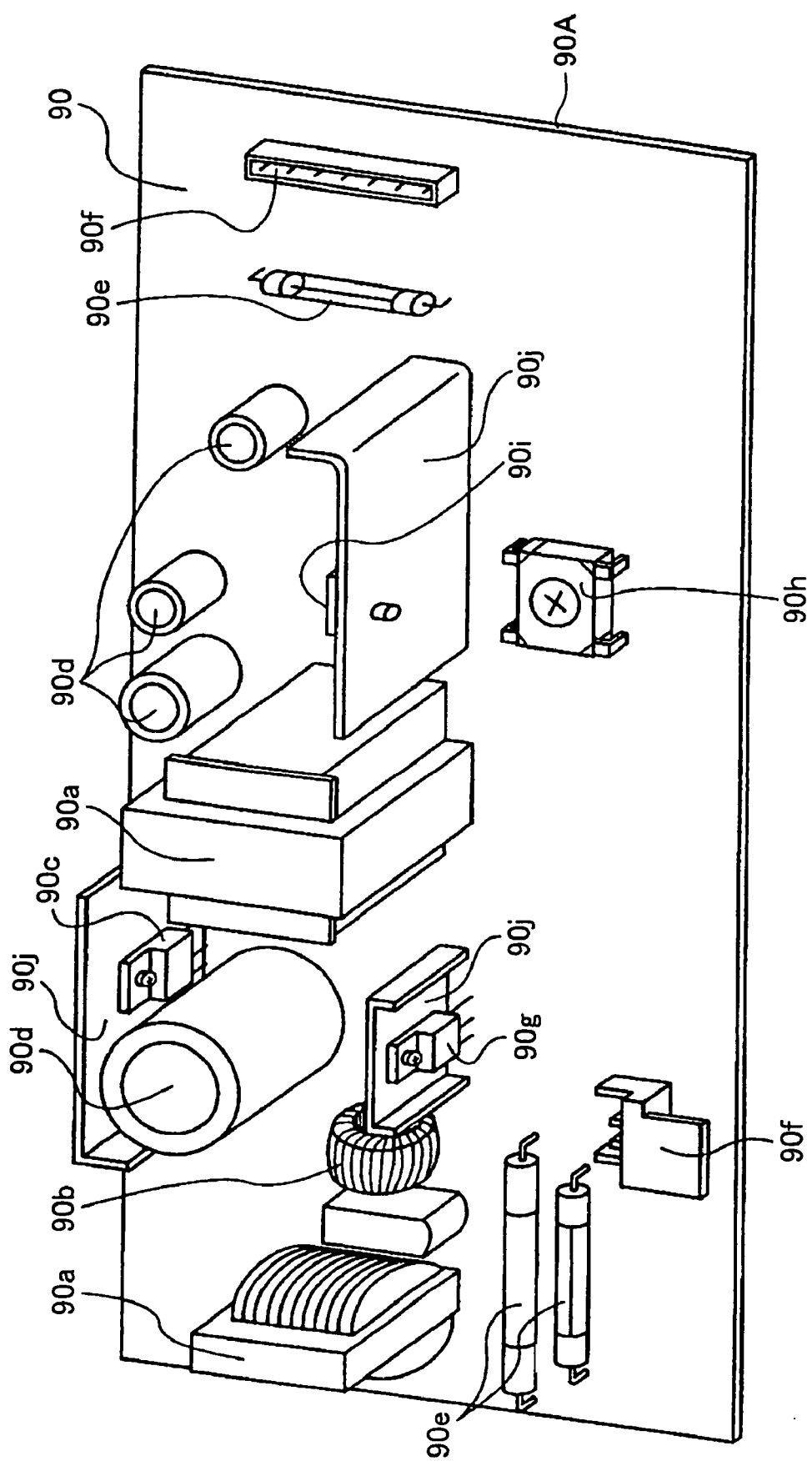
FIG. 7 is a perspective view showing a low-voltage power source circuit board.

As shown in FIG. 7, the low-voltage power source circuit board 90 includes a substantially rectangular circuit board 90A and a circuit configured of such electronic parts as transformers 90a, a coil 90b, a unipolar transistor (FET) 90c, capacitors 90d, fuses 90e, connectors 90f, a triac 90g, a variable resistor 90h, a constant voltage IC 90i, a resistor (not shown), and a diode (not shown) mounted on the circuit board 90A. As described above, the low-voltage power source circuit board 90 reduces the voltage supplied from the source external to the laser printer 1 and supplies the reduced voltage to components within the laser printer 1. A larger current flows in the circuitry of the low-voltage power source circuit board 90 than in the circuitry of the high-voltage power source circuit board 95. For this reason, the amount of heat generated from the transformers 90a, the FET 90c, the triac 90g, and the constant voltage IC 90i is greater than that generated from other electronic components. Therefore, steel heat sinks 90j are provided for dissipating heat from these components 90c, 90g, 90i, excluding the transformers 90a.

Each of the heat sinks 90j has a substantially rectangular plate body with either one edge or two opposing edges bent substantially perpendicular thereto, forming either an L-shape or a flattened U-shape cross section. The FET 90c, the triac 90g, and the constant voltage IC 90i are fixed to the plate surface of the corresponding heat sinks 90j by screws. Each of the heat sinks 90j is fixed to the circuit board 90A such that their plate surfaces extend in the lengthwise direction of the circuit board 90A and stand perpendicular to the surface thereof. With this construction, the plate surface of each heat sink 90j extends along the direction in which air flows through the intake hole 101 and is exhausted via the power source fan 116 through the exhaust outlets 110c and 202.

Figure 8:
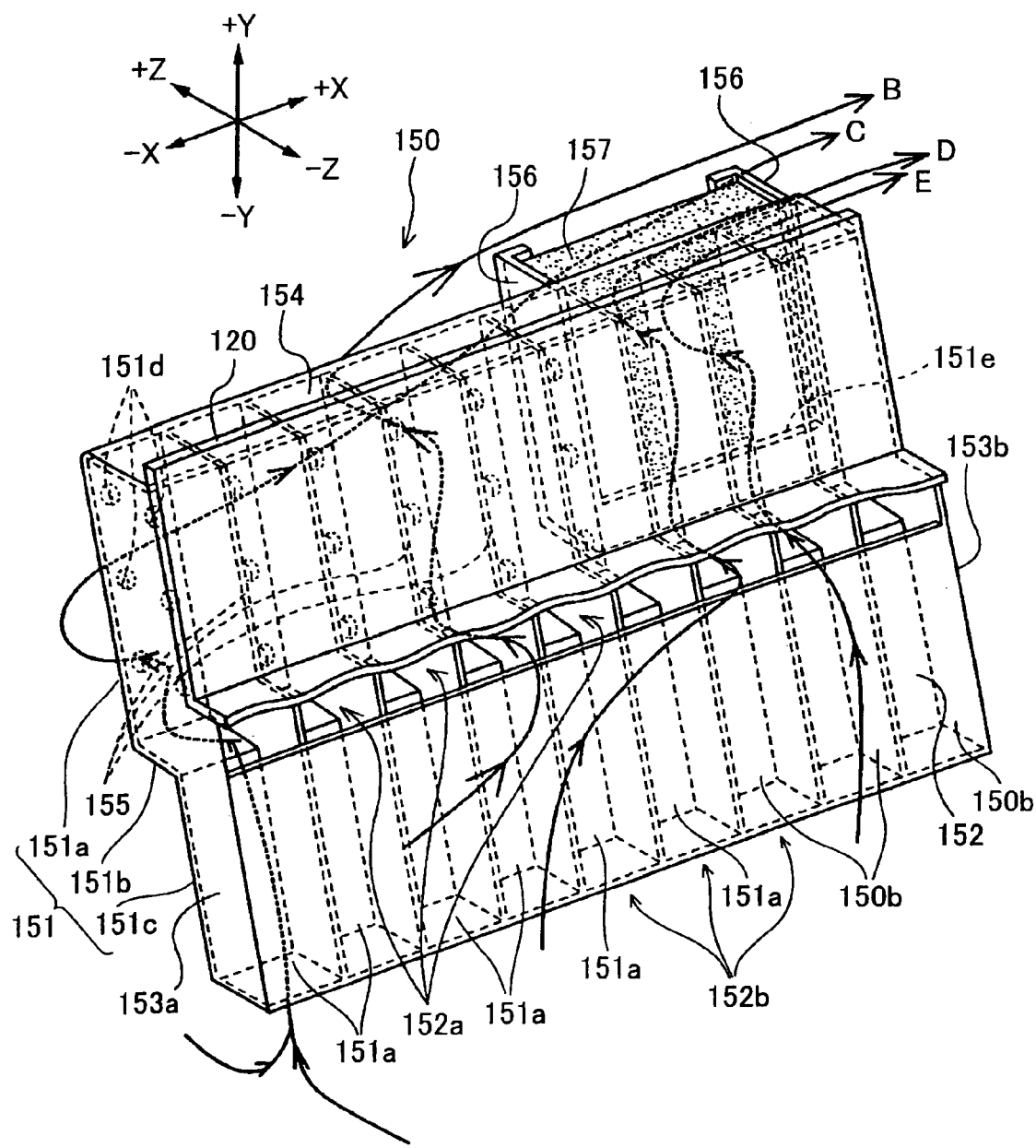
FIG. 8 is a perspective view showing a duct.

FIG. 8 shows a duct 150. The duct 150 is an exhaust channel for effectively exhausting air including heat emitted from the fixing unit 18 and air including ozone generated from the processing cartridge 17. As shown in FIG. 1, the duct 150 is disposed at a position surrounded by the scanning unit 16, the processing cartridge 17, the fixing unit 18, and the chute 80.

As shown in FIG. 8, the duct 150 includes wall plates 151 and 152, side plates 153a and 153b, the tray 120, and an upper plate 154. The wall plate 151 is a plate having a length nearly equivalent to the distance between the left and right frames 100 and 110 in the direction X. The wall plate 151 bends twice at substantially right angles to form a step portion at approximately the center in the short dimension of the wall plate 151. Accordingly, the wall plate 151 has an upper vertical surface 151a, a horizontal surface 151b, and a lower vertical surface 151c. A plurality of holes 151d and an open section 151e are formed in the upper vertical surface 151a. Retaining parts 156 for holding an ozone filter 157 are provided in the open section 151e. The wall plate 152 is disposed parallel to the lower vertical surface 151c, while the tray 120 is parallel to the upper vertical surface 151a. The wall plate 152 and the tray 120 are connected to the lower vertical surface 151c and the upper vertical surface 151a, respectively, by the side plates 153a and 153b. The upper plate 154 blocks the open portion in the top. Slot-shaped openings 152a are formed between the wall plate 152 and the tray 120.

The inside of the duct 150 is partitioned in the direction X (left-to-right direction) by a plurality of partitioning plates 155, forming nine elongated small chambers 150a and 150b extending in the direction Y (vertically). Air is introduced into each of the six small chambers 150a near the side plate 153a through the opening 152a and the opening 152b formed in the bottom, and flows externally through the plurality of holes 151d. Also, air is introduced into each of the three small chambers 150b near the side plate 153b through the openings 152a and 152b, and flows externally through the ozone filter 157.

As shown in FIG. 9, the fixing unit 18 contacts the lower vertical surface 151c of the duct 150. The duct 150 partitions a space M surrounded by the top surface of the fixing unit 18, the wall plate 151, and the wall surface of the discharge tray 46 (FIG. 1) from a space N surrounded by the bottom surface of the scanning unit 16 (FIG. 1), the processing cartridge 17, the top surface of the chute 80, and the wall plate 152 of the duct 150. With this construction, heat generated from the fixing unit 18 does not directly reach the processing cartridge 17. The opening 60 for the Scorotron charger 29 (FIG. 1) provided on the top surface of the processing cartridge 17 is in fluid communication with the openings 152a of the duct 150 via a space surrounded by the top surface of the processing cartridge 17 and the bottom surface of the tray 120.

Next, operations of the laser printer 1 during printing will be described with reference to FIG. 1. The sheet 3 located at the top among the sheets stacked on the sheet pressing plate 7 is pressed toward the sheet feed roller 8 by the spring 7b from the back of the sheet pressing plate 7. When printing is started, the sheet 3 is fed by frictional force between the sheet 3 and the rotating sheet feed roller 8 to a position between the sheet feed roller 8 and the separation pad 9. Then, the sheet feed roller 8 and the separation pad 9 together transport the sheets 3 one at a time to the registration roller 12.

The laser beam emitting section (not shown) of the scanner unit 16 generates a laser beam based upon a laser drive signal generated by the engine circuit board 98. The laser beam falls incident on the polygon mirror 19. The polygon mirror 19 provides the laser beam with a scan movement in a main scanning direction (direction perpendicular to the conveying direction of the sheet 3) while reflecting the laser beam toward the fθ lens 20. The fθ lens 20 converts the laser beam to a constant angular speed. Then, the reflecting mirror 21a reflects the laser beam toward the relay lens 22, which converges the laser beam. The reflecting mirror 21b reflects the converged laser beam to focus on the surface of the photosensitive drum 27.

The Scorotron charger 29 charges the surface of the photosensitive drum 27 to, for example, a surface potential of approximately 1000V. The laser beam from the scanner unit 16 scans across the surface of the photosensitive drum 27 in the main scan direction. The laser beam selectively exposes and does not expose the surface of the photosensitive drum 27 based on the laser drive signal described above. That is, portions of the surface of the photosensitive drum 27 that are to be developed are exposed by the laser light and portions that are not to be developed are not exposed. The surface potential of the photosensitive drum 27 decreases to, for example, approximately 100V at exposed portions (bright parts). Because the photosensitive drum 27 rotates clockwise as indicated by an arrow in FIG. 1 at this time, the laser beam also exposes the photosensitive drum 27 in an auxiliary scanning direction, which is also the conveying direction of the sheet 3. As a result of the two scanning actions, an electrical invisible image, that is, an electrostatic latent image is formed on the surface of the photosensitive drum 27 from exposed areas and unexposed areas (dark parts).

The toner in the toner hopper 34 is conveyed to the development chamber 37 according to the rotation of the agitator 36. Then, the toner in the development chamber 37 is supplied to the developing roller 31 according to the rotation of the supply roller 33. At this point, the toner is frictionally charged positively between the supply roller 33 and the developing roller 31 and is further regulated to a layer with constant thickness by the layer thickness control blade 32. Then, the toner is borne on the developing roller 31. A positive bias of, for example, approximately 300V to 400V is applied to the developing roller 31. The toner, which is borne on the developing roller 31 and charged positively, is transferred to the electrostatic latent image formed on the surface of the photosensitive drum 27 when the toner comes into contact with the photosensitive drum 27. That is, because the potential of the developing roller 31 is lower than the potential of the dark parts (+1000V) and higher than the potential of the bright parts (+100V), the positively-charged toner selectively moves to the bright parts where the potential is lower. In this way, a visible image of toner is formed on the surface of the photosensitive drum 27.

The registration rollers 12 perform a registration operation on the sheet 3 to deliver the sheet 3 so that the front edge of the visible image formed on the surface of the rotating photosensitive drum 27 and the leading edge of the sheet 3 coincide with each other. A negative constant voltage is applied to the transfer roller 30 while the sheet 3 passes between the photosensitive drum 27 and the transfer roller 30. Because the negative constant voltage that is applied to the transfer roller 30 is lower than the potential of the bright part (+100V), the toner electrostatically clinging to the surface of the photosensitive drum 27 moves toward the transfer roller 30. However, the toner is blocked by the sheet 3 and cannot transfer to the transfer roller 30. As a result, the toner is transferred onto the sheet 3. In this manner, the visible image formed on the surface of the photosensitive drum 27 is transferred onto the sheet 3.

It should be noted that the laser printer 1 employs what is known as a cleanerless developing system, wherein the developing roller 31 recovers toner remaining on a surface of the photosensitive drum 27 after the transfer roller 30 transfers toner from the photosensitive drum 27 to the paper 3.

Then, the sheet 3 having the toner transferred thereon is conveyed to the fixing unit 18. The heating roller 41 of the fixing unit 18 applies heat of approximately 200 degrees, and the pressing roller 42 applies a pressure, to the sheet 3 with the toner image to fix the toner image permanently on the sheet 3. Note that the heating roller 41 and the pressing roller 42 are each grounded through diodes so that the surface potential of the pressing roller 42 is lower than the surface potential of the heating roller 41. Accordingly, the positively charged toner that clings to the heating roller 41 side of the sheet 3 is electrically attracted to the lower surface potential of the pressing roller 42. Therefore, the potential problem of the toner image being distorted because the toner is attracted to the heating roller 41 at the time of fixing is prevented.

The sheet delivery roller 43 discharges the sheet 3 with the fixed toner image from the fixing unit 18 and conveys the sheet 3 on the sheet delivery path 44. The sheet delivery roller 45 delivers the sheet 3 to the sheet delivery tray 46 with a toner image side facing downward. Similarly, the sheet 3 to be printed next is stacked over the earlier delivered sheet 3 with a printed surface facing downward in the delivery tray 46. In this way, a user can obtain the sheets 3 aligned in the order of printing.

Next, passages for air discharged out of the laser printer 1 via the main fan 115 and the power source fan 116 will be described with reference to FIGS. 8 through 10. When the laser printer 1 is activated, components such as the fixing unit 18, the scanning unit 16, the DC motor 75, and the low-voltage power source circuit board 90 begin generating heat, causing the overall temperature within the laser printer 1 to rise. Heat generated by the DC motor 75 is much smaller than that generated by the low-voltage power source circuit board 90.

As shown in FIG. 9, when the main fan 115 rotates, air in the space M above the fixing unit 18 is drawn to the main fan 115, thereby exhausting air including heat generated by the fixing unit 18 out of the main body case 2 through the exhaust outlets 110b and 201. Since air in the space M is drawn to the main fan 115, air in the small chambers 150a and 150b is drawn through the holes 151d of the duct 150 and the ozone filter 157, as shown in FIG. 8. At this time, the small chambers 150a and 150b all have a negative pressure, allowing air external to the duct 150 to be drawn therein via the openings 152a and the openings 152b.

As shown in FIG. 9, air including heat generated from the bottom of the fixing unit 18 moves along the top surface of the chute 80 toward the processing cartridge 17, passing below the duct 150. However, as this air passes beneath the duct 150 and meets a flow of air being drawn from the processing cartridge 17 side toward the openings 152b of the duct 150, the flow of air from the bottom of the fixing unit 18 does not counter this flow from the processing cartridge 17, but instead joins the flow being drawn into the duct 150. This air flow passes through the small chambers 150a and 150b, is exhausted out of the duct 150 through the holes 151d and the like, joins the flow of air including heat from the top of the fixing unit 18, and is exhausted from the main body case 2 by the main fan 115. An arrow C in the drawing indicates an example of this air channel.

Air between the processing cartridge 17 and the tray 120 is drawn into the small chambers 150a and 150b, having a negative pressure, via the openings 152a, as indicated by arrows B, D, and E. However, since the small chambers 150b nearest the main fan 115 have a greater negative pressure than that of the small chambers 150a farther away, the small chambers 150b have a stronger drawing power than the small chambers 150a and, hence, draw air from between the processing cartridge 17 and the tray 120. In other words, of the small chambers 150a and 150b aligned in the left-to-right direction X, the small chamber 150b nearest the main fan 115 has the strongest drawing power. Accordingly, air in this area is drawn toward the right (direction +X) through the openings 152a of the small chambers 150b on the main fan 115 side, even while the air is drawn toward the back (direction +Z).

Although the ozone filter 157 offers resistance to the airflow, the surface area of the opening 151e in the wall plate 151 of the small chambers 150b, in which the ozone filter 157 is provided, is much larger than the surface area of the holes 151d in the upper vertical surface 151a of the small chambers 150a, which have no ozone filter 157. Accordingly, the drawing power of the main fan 115 is greater in the small chambers 150b nearest thereto than in the other chambers 150a. Hence, air to the left side on the top surface of the processing cartridge 17 (direction −X side) flows along a diagonal path toward the right side (direction +X).

With this construction, air including ozone emitted through the opening 60 in the top surface of the processing cartridge 17 follows a diagonal airflow path along the top surface of the processing cartridge 17 and is drawn through the openings 152a into the chambers 150b nearest the main fan 115, as indicated by the arrow E. Air including ozone emitted through the portion of the opening 60 farthest from the main fan 115 flows diagonally along the top surface of the processing cartridge 17 and is drawn into the small chambers 150b via the openings 152a, as indicated by the arrow D. The ozone is removed from this air as the air passes through the ozone filter 157, and the air is exhausted toward the fixing unit 18 (direction +Z). This airflow joins air including heat generated from the top of the fixing unit 18 and is exhausted through the exhaust outlets 110b and 201 out of the main body case 2 by the main fan 115. Further, since the flow of air indicated by arrows C, D, and E cools the tray 120, the scanning unit 16 supported on the tray 120 is also cooled.

As described above, the space surrounded by the chute 80, the circuit boards 90, 95, 98, the steel plate (not shown), and the left and right frames 100 and 110 forms the exhaust passage. This exhaust passage enables air drawn through the intake hole 101 formed in the left frame 100 to be exhausted out of the main body case 2 through the power source fan 116 provided in the right frame 110.

Figure 10:
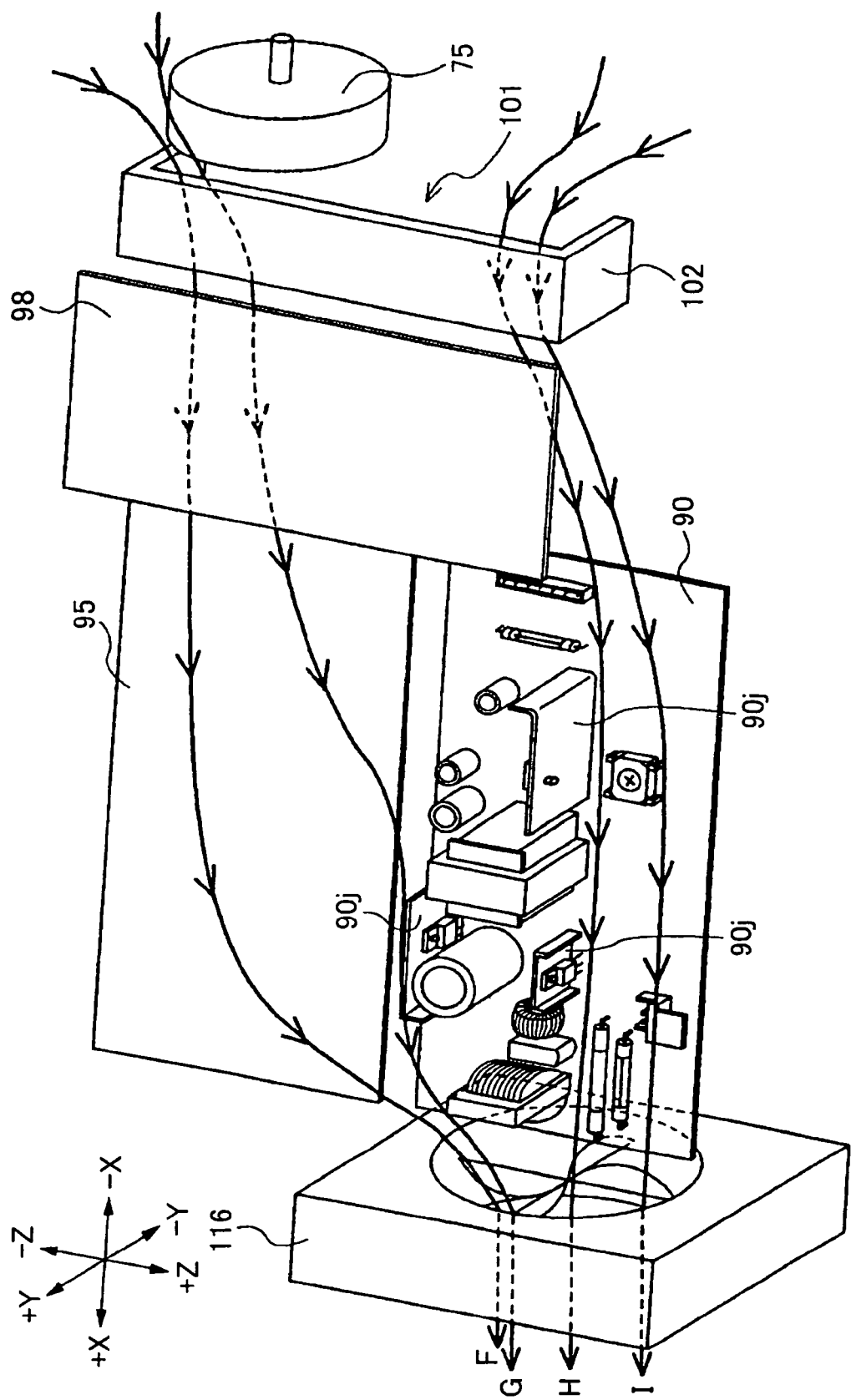
FIG. 10 is a perspective view showing channels of air passing over the circuit boards.

As shown in FIG. 10, when the power source fan 116 rotates, the above-described exhaust passage becomes negative in pressure, causing air to be introduced therein via the intake hole 101, as indicated by the arrows H and I. While the air flows through among the gears 71 of the drive system 72 provided in the left frame 100, in which the intake hole 101 is also provided, and flows through the intake hole 101, the air passes alongside the DC motor 75 disposed near the intake hole 101 owing to the hood 102 and the air passage openings 73a and 73b (FIG. 6) formed in the support plate 73. Arrows F and G indicate examples of this airflow.

With this construction, heat generated by the driving of the DC motor 75 is captured in air passing along the side thereof, thereby cooling the DC motor 75. Further, air flowing through the intake hole 101 cools components provided on the circuit boards as the air passes over the circuit boards 90, 95, 98 and is discharged out of the main body case 2 by the power source fan 116.

As described above, the heat sinks 90j provided to the low-voltage power source circuit board 90 are arranged along the flow direction for air passing in the direction X of the exhaust passage. Accordingly, the heat sinks 90j do not hinder the flow of air passing through the exhaust passage, minimizing the resistance to the airflow. Further, the low-voltage power source circuit board 90, on which are provided electronic components that generate a larger amount of heat than those on the high-voltage power source circuit board 95 and the engine circuit board 98, is disposed downstream from the high-voltage power source circuit board 95 and the engine circuit board 98 in the direction of airflow. Hence, air heated by the low-voltage power source circuit board 90 does not heat the high-voltage power source circuit board 95 and the engine circuit board 98, but is quickly exhausted by the power source fan 116 out of the main body case 2 through the exhaust outlets 110c and 202. In this way, air including heat within the exhaust passage can be efficiently exhausted from the main body case 2, thereby minimizing temperature increases in the main body case 2. Further, the DC motor 75 is disposed near the intake hole 101, since the amount of heat generated from the DC motor 75 is much smaller than that generated by the low-voltage power source circuit board 90. Accordingly, the DC motor 75 can be efficiently cooled without hindering cooling of the low-voltage power source circuit board 90.

In the image forming device described above, the chute 80 is disposed between the fixing unit 18 and the processing cartridge 17 and the circuit boards 90, 95, and 98, enabling the main fan 115 and the power source fan 116 provided in the right frame 110 to discharge air above the chute 80 and air below the chute 80, respectively. By separating the airflow formed by the main fan 115 and the airflow formed by the power source fan 116 using the chute 80, the air including generated heat in one airflow is prevented from combining with the other airflow. Further, by reducing the cooling range, the present invention can enhance the cooling effect of the fans 115, 116. Since the main fan 115 is positioned closer to the fixing unit 18 than to the processing cartridge 17, air including heat generated from the fixing unit 18 can be discharged from the main body case 2 by the main fan 115 without flowing to the processing cartridge 17.

Further, since both the main fan 115 and the power source fan 116 are provided in the right frame 110, it is possible to correct the airflow in the main body case 2 to a direction from the left frame 100 toward the right frame 110, thereby preventing heated air in the main body case 2 from being circulated.

The ozone filter 157 is provided in the duct 150 only in an area through which air including ozone passes. Therefore, ozone can be efficiently removed from the air and subsequently the air can be exhausted, without the ozone filter 157 presenting resistance to the flow of air that does not include ozone. Hence, it is possible to remove ozone without reducing the cooling efficiency for the fixing unit 18. Further, by using the duct 150, air in the area farthest from the main fan 115 can be efficiently exhausted.

While the invention has been described in detail with reference to specific embodiments thereof, it would be apparent to those skilled in the art that many modifications and variations may be made therein without departing from the spirit of the invention, the scope of which is defined by the attached claims.

For example, the duct 150 is partitioned into the plurality of small chambers 150a and 150b in the embodiment described above. However, the duct 150 can be configured as a single exhaust passage with no partitions. Further, the ozone filter 157 is disposed on a portion of the upper vertical surface 151a in the above embodiment. However, the ozone filter 157 can also be provided over the entire surface. Further, the holes 151d are formed in a portion of the upper vertical surface 151a, and air flowing to the main fan 115 from the processing cartridge 17 side passes over the top of the fixing unit 18. However, air from the processing cartridge 17 side can be discharged directly through the main fan 115 via the duct 150. Further, the ozone filter 157 can be provided on the wall surface of the duct 150 on the processing cartridge 17 side or inside the duct 150.

What is claimed is:

1. An image forming device comprising:
a main casing having a first surface and a second surface opposing the first surface;
a processing unit that is detachably mounted in the main casing and that forms images on a recording medium;
a power source circuit board disposed inside the main casing for outputting a drive voltage to drive the processing unit; and
a high-voltage power source circuit board disposed below the processing unit, the high-voltage power source circuit board outputting a drive voltage of a higher voltage than the drive voltage outputted by the power source circuit board, wherein:
the first surface of the main casing is formed with a first exhaust outlet for exhausting air from the main casing; and
the power source circuit board is disposed adjacent to the first exhaust outlet and is positioned closer to the first exhaust outlet than the high-voltage power source circuit board.

2. The image forming device according to claim 1, wherein the components of the power source circuit board generate greater amount of heat than the high-voltage power source circuit board.

3. The image forming device according to claim 1, wherein the power source circuit board has heat dissipating plates that dissipate heat generated by the components of the power source circuit board, the heat dissipating plates being disposed such that a largest surface of each heat dissipating plate is disposed along an air passage direction in which the air flows through the main casing.

4. The image forming device according to claim 1, further comprising a drive motor that generates a driving force, wherein the second surface of the main casing is formed with an intake hole through which air is supplied into the main casing, the air flowing over the power source circuit board and being exhausted through the first exhaust outlet, the drive motor being disposed near the intake hole.

5. The image forming device according to claim 1, further comprising a first fan disposed in confrontation with the first exhaust outlet for exhausting air from the main casing.

6. The image forming device according to claim 5, further comprising a second fan, wherein the first surface of the main casing is formed with a second exhaust outlet, and the second fan is disposed in confrontation with the second exhaust outlet of the main casing for exhausting air from the main casing.

7. The image forming device according to claim 6, further comprising a first partitioning wall, wherein the main casing defines an internal space, and the first partitioning wall separates the internal space into a first air path formed by the first fan and a second air path formed by the second fan.

8. The image forming device according to claim 7, further comprising:
 a conveying unit that conveys the recording medium in a conveying direction; and
 a fixing unit that is disposed downstream of the processing unit in the conveying direction and that fixes the images onto the recording medium, wherein
 the second fan is disposed closer to the fixing unit than to the processing unit.

9. The image forming device according to claim 8, further comprising a second partitioning wall provided between the fixing unit and the processing unit, the second partitioning wall partitioning the second air path into a third air path on the processing unit side and a fourth air path on the fixing unit side.

10. The image forming device according to claim 9, further comprising an ozone filter disposed in the third air path.

11. The image forming device according to claim 10, further comprising a first frame and a second frame disposed within the main casing, wherein:
 the first fan and the second fan are provided to the first frame;
 the first partitioning wall bridges the first frame and the second frame;
 the processing unit, the fixing unit, and the second fan are disposed above the first partitioning wall; and
 the power source circuit board is disposed beneath the first partitioning wall.

* * * * *